(12) United States Patent
Agnello et al.

(10) Patent No.: US 6,287,913 B1
(45) Date of Patent: Sep. 11, 2001

(54) DOUBLE POLYSILICON PROCESS FOR PROVIDING SINGLE CHIP HIGH PERFORMANCE LOGIC AND COMPACT EMBEDDED MEMORY STRUCTURE

(75) Inventors: Paul D. Agnello, Wappingers Falls; Bomy A. Chen, Stormville; Scott W. Crowder, Ossining; Ramachandra Divakaruni, Middletown; Subramanian S. Iyer, Mount Kisco, all of NY (US); Dennis Sinitsky, Hsin-chu (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/427,506

(22) Filed: Oct. 26, 1999

(51) Int. Cl.[7] .............................................. H01L 21/8242
(52) U.S. Cl. ...................... 438/241; 438/275; 438/258; 438/592
(58) Field of Search ................................ 438/239, 241, 438/257, 258, 592, 238, 233, 210, 200, 152, 164, 249, 259, 316, 287, 253, 255, 275

(56) References Cited

U.S. PATENT DOCUMENTS

| | | | |
|---|---|---|---|
| 4,766,088 | 8/1988 | Kono et al. .......................... 437/52 |
| 5,668,035 | 9/1997 | Fang et al. .......................... 438/239 |
| 5,759,889 | 6/1998 | Sakao .................................. 438/241 |
| 5,843,817 | 12/1998 | Lee et al. ............................ 438/239 |
| 5,858,830 | 1/1999 | Yoo et al. ............................ 438/241 |
| 5,858,831 | 1/1999 | Sung .................................... 438/241 |
| 5,863,820 | 1/1999 | Huang .................................. 438/241 |
| 5,866,451 | 2/1999 | Yoo et al. ............................ 438/241 |
| 5,879,990 | 3/1999 | Dormans et al. .................... 438/257 |

Primary Examiner—Charles Bowers
Assistant Examiner—Yennhu B. Huynh
(74) Attorney, Agent, or Firm—Ratner & Prestia; H. Daniel Schnurmann

(57) ABSTRACT

A process for fabrication of both compact memory and high performance logic on the same semiconductor chip. The process comprises forming a memory device in the memory region, forming a spacer nitride layer and a protective layer over both the memory region and the logic region, removing the protective layer over the logic region to expose the substrate, and forming the logic device in the logic region. Cobalt or titanium metal is applied over all horizontal surfaces in the logic region and annealed, forming a salicide where the metal rests over silicon or polysilicon regions, and any unreacted metal is removed. An uppermost nitride layer is then applied over both the memory and logic regions and is then covered with a filler in the logic region. Chip structures resulting from various embodiments of the process are also disclosed.

34 Claims, 7 Drawing Sheets

DOUBLE POLYSILICON PROCESS FOR PROVIDING SINGLE CHIP HIGH PERFORMANCE LOGIC AND COMPACT EMBEDDED MEMORY STRUCTURE

TECHNICAL FIELD

The present invention relates generally to fabrication of semiconductor chips and, more specifically, to the fabrication of both compact memory and high performance logic on the same semiconductor chip.

BACKGROUND OF THE INVENTION

Embedded memory, such as embedded dynamic random access memory (DRAM), is one of the fastest growing segments of the semiconductor industry. Two types of embedded DRAM processes currently exist: one that makes compact DRAM cells and low performance logic, and another that makes large DRAM cells and high performance logic. Embedded static random access memory (SRAM) processes also offer only compact SRAM cells with low performance logic or large SRAM cells with high performance logic. Thus, it is desirable to provide a process for manufacturing both compact embedded memory, such as compact DRAM or SRAM cells, and high performance logic, on the same chip.

In particular, in certain advanced DRAM processes, the memory gate stack has a nitride film on top, which allows a borderless contact to be made to the gate in a memory cell. On the other hand, certain high performance logic processes do not provide such a thick nitride film on top of the logic gate stack. The reason for this configuration is that a tall polysilicon-nitride stack would compromise across-chip linewidth variation (ACLV), which is a key parameter in maintaining the high performance desired in high performance logic.

Also, in many processes for combined logic and memory, the polysilicon gates in both regions are created simultaneously, as are the sidewall oxides. Because the optimum characteristics of gate and memory sidewall oxides are mutually exclusive (thin logic sidewall oxides and thick memory sidewall oxides are optimal), the sidewall oxides created simultaneously tend to reflect a compromise in characteristics which is not optimal for either region. In addition, logic well implants tend to be created at the same time as memory well implants, meaning that the logic well implants are subject to degradation during memory processing. Therefore, the combination of memory and logic processes has not resulted in optimal structural characteristics for either the memory or logic regions.

The deficiencies of the conventional semiconductor chip manufacturing processes show that a need still exists for a combined memory and logic creation process that provides the structural characteristics typically provided by stand-alone high performance logic processes and stand-alone compact embedded memory processes. To overcome the shortcomings of the conventional processes, a new process is provided. An object of the present invention is to provide a process that is compatible both with an advanced DRAM process that creates memory cells with nitride films on top, allowing a borderless contact between the gate and memory cell, and with a high performance logic process that creates a logic device without such a nitride film on top.

Another object of the present invention is to provide a process that forms the memory sidewall oxide as a step completely decoupled from the formation of the logic sidewall oxide. Thus, the memory sidewall oxide may be tailored for improved memory retention characteristics whereas the logic sidewall oxide may be tailored for improved logic device performance. Still another object of the present invention is to provide a process that completes the entire set of memory processing steps before the logic well implants are created. A related object is to prevent any substantial degradation in the logic device due to exposure to high temperature memory processing steps. It is yet another object of the present invention to provide a process in which the BPSG layer is deposited before logic gate formation. A related object is to permit densification of the BPSG layer at high temperature (thus allowing a tight-pitch memory array) without adversely affecting the logic devices.

SUMMARY OF THE INVENTION

To achieve these and other objects, and in view of its purposes, the present invention provides a double polysilicon process for fabricating a semiconductor chip having a memory device and a logic device on the same chip. The process comprises providing a substrate having a top surface, a memory region, a logic region, and a pad nitride layer overlaying at least the logic region. The substrate also has a plurality of shallow trench isolation trenches.

The process further comprises forming the memory device in the memory region (including the first polysilicon and other gate layer deposition and etching steps, and a sidewall oxidation step), then applying first a spacer nitride layer and second a protective layer over both the memory region and the logic region, and then removing the protective layer over the logic region to expose the substrate. Next, the logic device is formed in the logic region (including the second polysilicon deposition and etching step, and a sidewall oxidation step). The step of forming the logic device also includes applying a metal, such as cobalt or titanium, over all horizontal surfaces in the logic region and conducting an annealing step sufficient for the metal to form a metal salicide where the metal rests over silicon or polysilicon regions. Unreacted metal over non-silicon and non-polysilicon regions may be later removed.

The memory devices may be protected during the salicidation step by depositing a nitride layer over both the memory region and the logic region and then removing the nitride layer from the logic region before applying the metal to the logic device. In another embodiment, an oxide layer protects the memory device during salicidation. In yet another embodiment, a Boro-Phospho Silicate Glass (BPSG) layer is first applied, densified, and etched to remain only over the memory region before logic gate formation. In each embodiment, an uppermost nitride layer is deposited after applying the metal to the logic device, and a dielectric layer is then deposited over the nitride layer.

The present invention also encompasses a semiconductor chip comprising at least one embedded memory device and at least one high performance logic device produced according to the process outlined above. The embedded memory device may comprises a memory gate stack having an n-type polysilicon layer, a tungsten-containing layer (such as tungsten silicide or tungsten-tungsten nitride) on top of the polysilicon layer, and a silicon nitride cap layer on top of the tungsten silicide layer. The high performance logic device may comprise a logic gate stack having a polysilicon layer and a cobalt or titanium salicide layer on top of the polysilicon layer.

In one embodiment, the memory gate stack may comprise: the n-type polysilicon layer, the tungsten-containing layer, and the silicon nitride cap layer, each layer having at least one sidewall; a sidewall oxide tuned for memory-retention characteristics over the sidewalls of the n-type polysilicon layer and, optionally, over the tungsten-containing layer; and a nitride sidewall spacer covering the oxide and silicon nitride cap layer.

The logic gate stack may consist essentially of: the polysilicon layer having a top surface and a sidewall, a sidewall oxide over the polysilicon layer sidewall and having a horizontal surface level with the polysilicon layer top surface, a nitride logic spacer over the sidewall oxide and over a portion of the substrate immediately adjacent the logic gate stack and having one or more horizontal surfaces parallel to the substrate top surface, and the cobalt or titanium salicide layer over the polysilicon layer and the horizontal surface of the sidewall oxide. The chip may further comprise a nitride layer over the memory region, a cobalt or titanium salicide layer over the substrate top surface in the logic region, one or more logic shallow trench isolations in the logic region, and at least one border shallow trench isolation separating the logic region from the memory region.

In another embodiment, the chip may comprise a memory BPSG filler over the nitride layer in the memory region, the memory BPSG filler having a top surface level with the top surface of the nitride layer over the memory gate stack; a tetra-ethyl-ortho-silicate (TEOS) layer over the memory BPSG filler and over the nitride layer on the memory gate stack; a TEOS spacer separating the memory region from the logic region; and an uppermost nitride layer extending over the TEOS layer, over the TEOS spacer, and over the cobalt or titanium salicide layer and logic gate stack in the logic region. A logic BPSG fill in the logic region may have a top surface that is level with the uppermost nitride layer top surface in the memory region.

It is to be understood that both the foregoing general description and the following detailed description are meant to exemplify, but not to restrict, the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
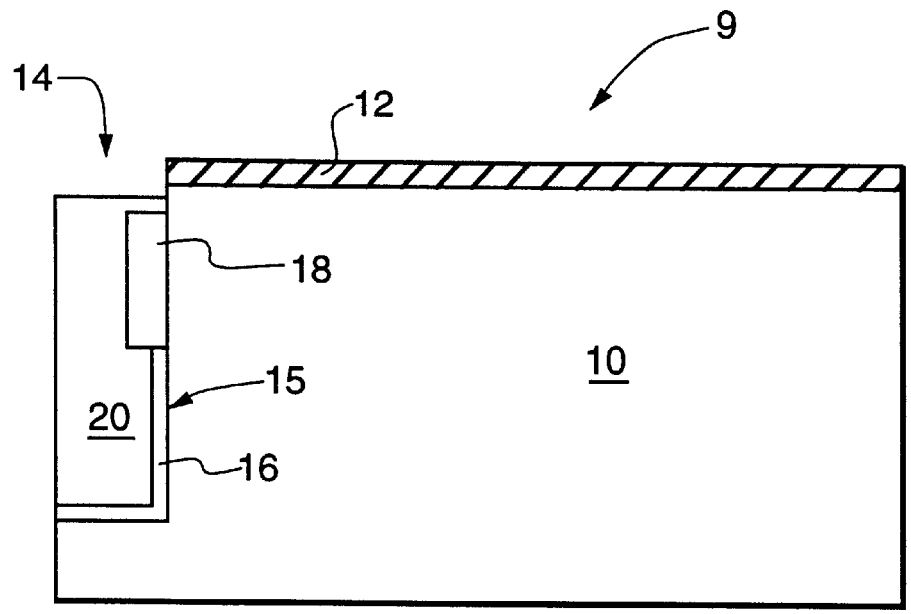
FIG. 1 is a cross sectional view of a silicon chip substrate incorporating a deep trench capacitor, with only certain materials cross-hatched for emphasis.

Referring now to the drawing, wherein like reference numbers refer to like elements throughout, FIGS. 1 through 9 and 12 show a first embodiment of the process according to the present invention.

As shown in FIG. 1, the process according to this invention, for forming an exemplary semiconductor chip 9, starts with a typical semiconductor substrate 10 (such as silicon) over which a pad nitride layer 12 is deposited. Pad nitride layer 12 is first opened to provide a patterned pad nitride layer having open regions where deep trenches 14 are etched, as is known in the art. A node dielectric 16 and a collar 18 are formed on the sidewalls 15 of trench 14 (only right sidewall 15 shown), and the trench 14 is filled with polysilicon 20 as is known in the art. In the various figures referred to throughout this application, nitride-based layers are shown with a diagonal cross-hatching that is drawn from upper right to lower left; oxide-based layers are cross-hatched with diagonals going from upper left to lower right. Only selected other cross-hatching is used in the figures, as discussed later, to reduce clutter in the figures.

Figure 2:
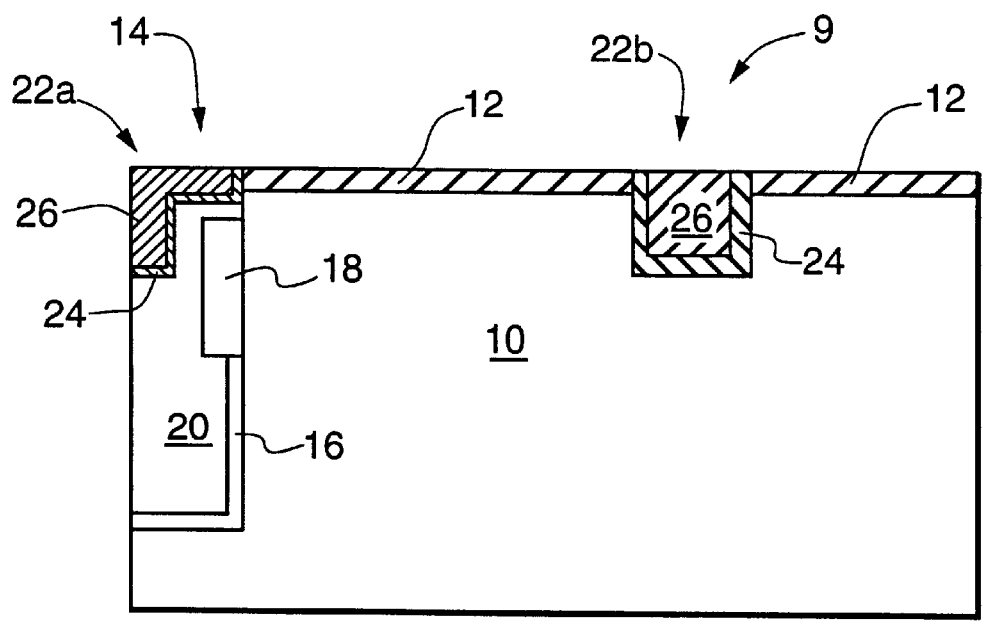
FIG. 2 is a cross sectional view of the silicon chip of FIG. 1, after the incorporation of shallow trench isolation.

Referring now to FIG. 2, shallow trench isolation trenches 22a and 22b, typically between 0.25 $\mu$m and 0.5 $\mu$m deep, are then formed; lined with an optional nitride liner 24 over oxidized silicon (not shown); and filled with an oxide 26, as is known in the art. A chemical mechanical polishing (CMP) step, as is known in the art, is then performed to remove excess oxide from the surface of pad nitride 12.

Figure 3:
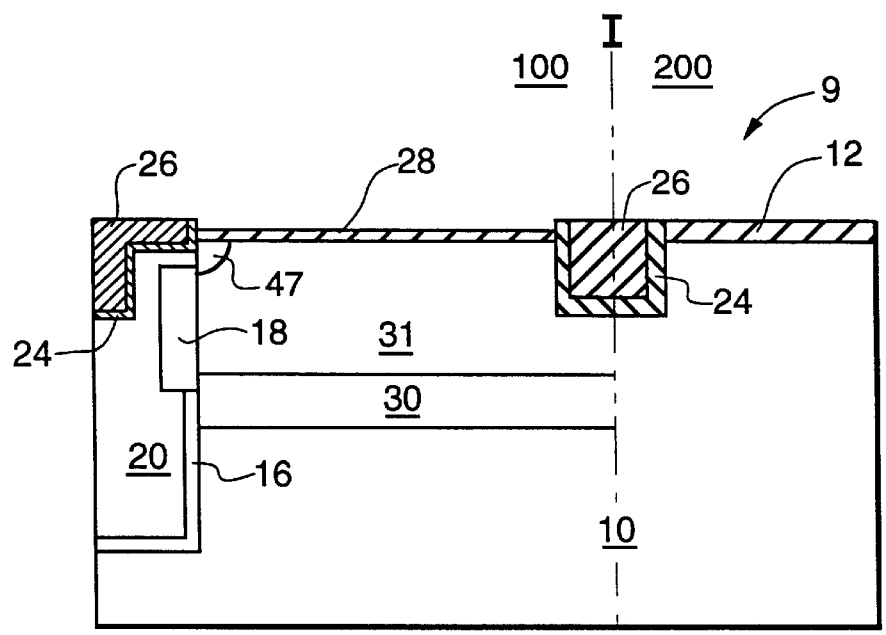
FIG. 3 is a cross sectional view of the silicon chip of FIG. 2, showing the imaginary line that separates the memory region from the logic region, with implants in the memory region.

Referring now to FIG. 3, the substrate 10 can be envisioned as having a memory region 100 (to the left of imaginary line I) and a logic region 200 (to the right of imaginary line I). Pad nitride layer 12 is first removed from the memory region 100, such as by a reactive ion etching (RIE) process, exposing substrate 10. Pad nitride layer 12 in memory region 100 may also be chemically removed by depositing a thin oxide (not shown) over the entire chip 9 and removing the oxide over the memory region 100, such as via a masking step. The oxide remaining over logic region 200 then can protect the underlying pad nitride layer 12 of the logic region 200 during a wet etch removal of the pad nitride layer 12 in memory region 100 by a known etchant such as hot phosphoric acid or HF/glycerol.

A sacrificial oxide layer 28, typically 50 to 100 Angstroms thick, is then grown over exposed silicon substrate 10 in memory region 100, as is known in the art. Logic region 200 is then masked while implants, such as isolation phosphorus n-band implants 30 and p-well implants 31, are added to memory region 100. Outdiffusions 47 may begin to diffuse outwardly from trench polysilicon 20 as a result of the thermal cycling of the sacrificial oxide growth step. This diffusion will continue with continued thermal cycling in future steps.

Figure 4:
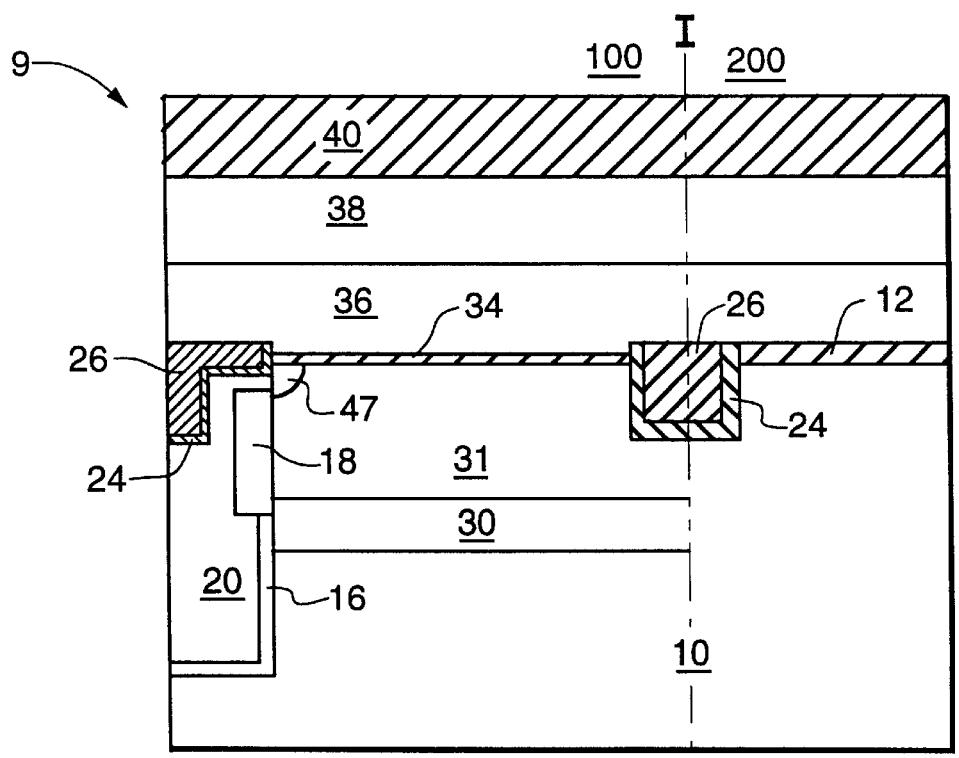
FIG. 4 is a cross sectional view of the silicon chip of FIG. 3, showing the various layers that form the memory gate stack.

Referring now to FIG. 4, sacrificial oxide layer 28 is removed from memory region 100, such as with a hydrofluoric acid (HF) etch, again exposing portions of substrate 10 in memory region 100. Remaining pad nitride layer 12 continues to mask logic region 200 to avoid etching of the logic region 200 during the HF etch. Gate oxide 34 is grown over the exposed portions of substrate 10. An n-type polysilicon layer 36, followed by a tungsten silicide ($WSi_x$) layer 38, or a combined layer of tungsten (W) and tungsten nitride (WN), and finally a nitride cap 40 are deposited as known in the art.

Figure 5:
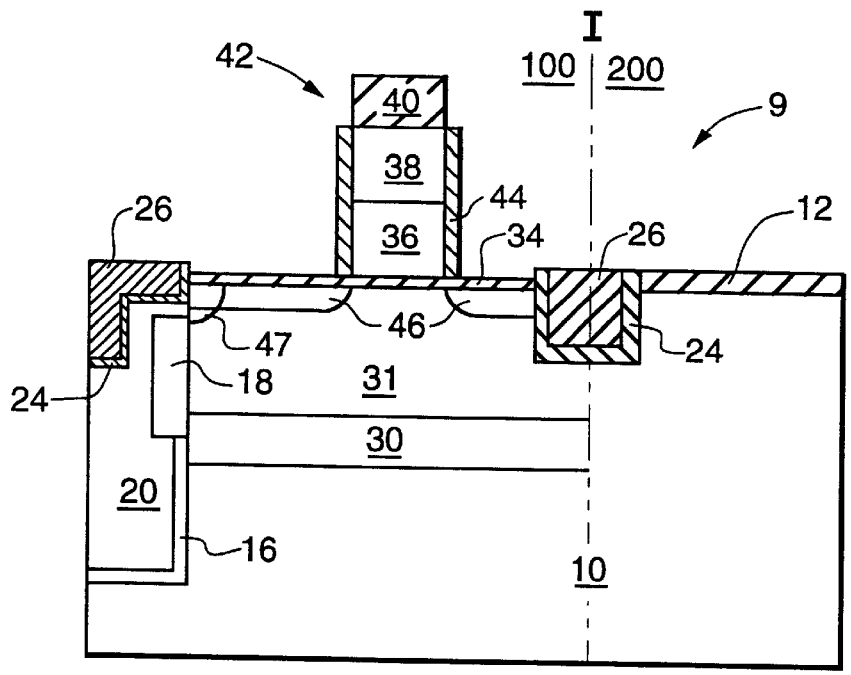
FIG. 5 is a cross sectional view of the silicon chip of FIG. 4, showing the memory gate stack after an etching step and after formation of array extension implants.

Referring now to FIG. 5, polysilicon layer 36, tungsten-containing ($WSi_x$ or W/WN) layer 38, and nitride cap layer 40 are patterned and etched as is known in the art, leaving memory gate stack 42 in memory region 100, but completely removing layers 36, 38, and 40 in logic region 200. A sidewall oxide 44 tuned for memory retention characteristics by reducing electric field at the gate edges during the growth step as is known in the art, nominally 10 nm thick is grown on the sidewall of the memory gate stack 42 from the polysilicon layer 36 and, optionally, from tungsten-containing layer 38. Sidewall oxide 44 only grows over layer 38, however, if layer 38 comprises $WSi_x$. Array extension implants 46, typically arsenic or phosphorus, are then implanted in memory region 100.

Figure 6:
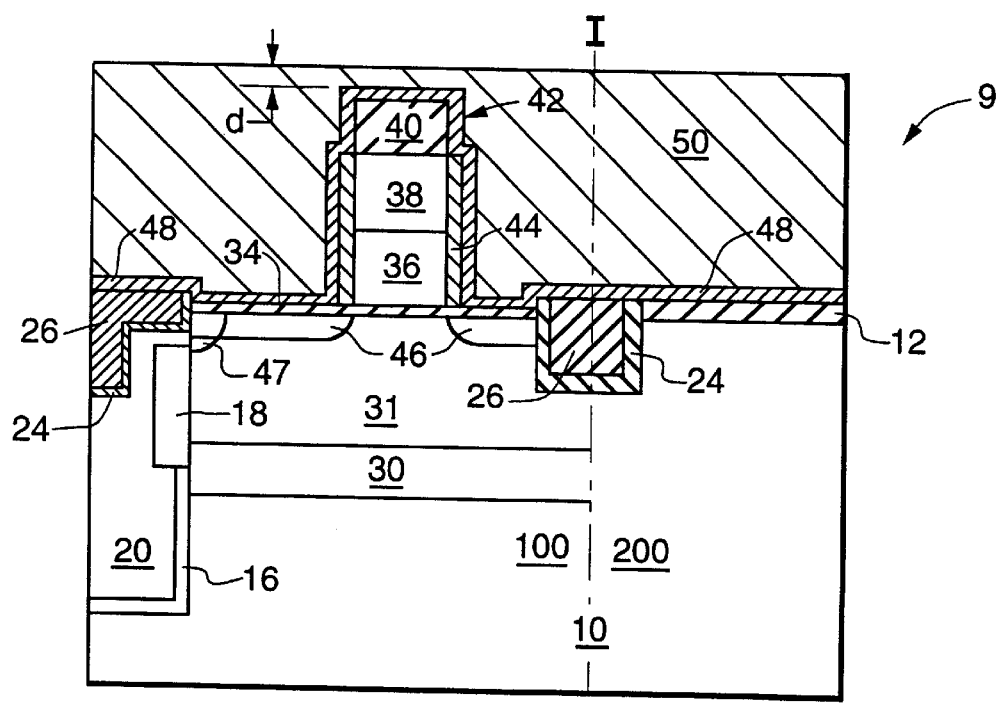
FIG. 6 is a cross sectional view of the silicon chip of FIG. 5, illustrating an intermediate process step creating a protective layer.

Referring now to FIG. 6, a nitride (or oxynitride) layer 48 having a thickness of typically 10 to 40 nm is deposited, followed by deposition of a thick protective layer 50 of an oxide such as tetra-ethyl-ortho-silicate (TEOS) or high-density plasma (HDP) oxide. A CMP step is then performed to planarize the surface of the protective layer 50, leaving a distance d of about 500 Angstroms above nitride layer 48 over memory gate stack 42. Before nitride layer 48 is deposited, an optional nitride spacer may be formed on the sidewall of stack 42.

Figure 7:
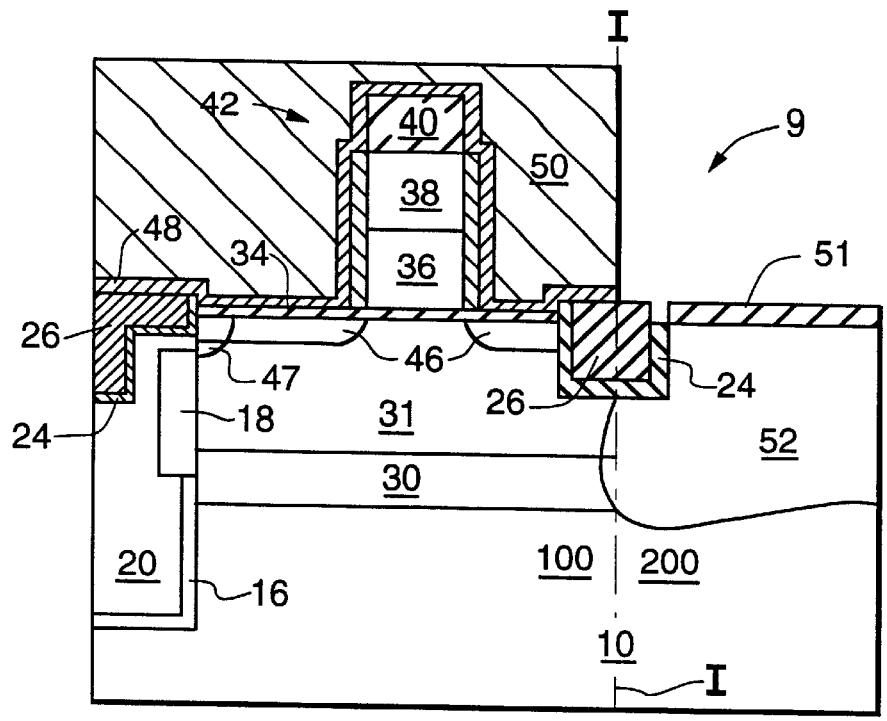
FIG. 7 is a cross sectional view of the silicon chip of FIG. 6, illustrating the removal of the protective layer from the logic region and the formation of implants on the logic region.

Referring now to FIG. 7, a photoresist, not shown, is exposed over logic region 200 so that protective layer 50 may be etched away over logic region 200, such as by an HF etch. The photoresist is then removed. Nitride layer 48 and pad nitride layer 12 (shown in FIG. 6) are removed from logic region 200 by RIE or by hot phosphoric acid, as is known in the art, exposing portions of substrate 10 in logic region 200. Logic sacrificial oxide 51 is grown over the exposed portions of substrate 10. Logic well implants 52 are then implanted through logic sacrificial oxide 51 and a well rapid thermal annealing step is conducted.

In an alternate process embodiment, pad nitride layer 12 shown in FIG. 2 may be removed from both memory region 100 and logic region 200 before growing sacrificial oxide layer 28, which then grows over both the memory and logic regions. After the memory implants are formed, the logic sacrificial oxide 51 in logic region 200 is protected with a block mask while the memory side sacrificial oxide 28 is stripped. Thus, logic sacrificial oxide 51 over logic region 200 as shown in FIG. 7 may be grown at the same time as sacrificial oxide 28 as shown in FIG. 3. Therefore, the logic well implants 52 may be implanted and the rapid thermal anneal conducted immediately after removing spacer nitride layer 48 shown in FIG. 6 (in such case spacer nitride layer 48 lies over logic sacrificial oxide 51 rather than pad nitride layer 12, which was previously removed).

Figure 8:
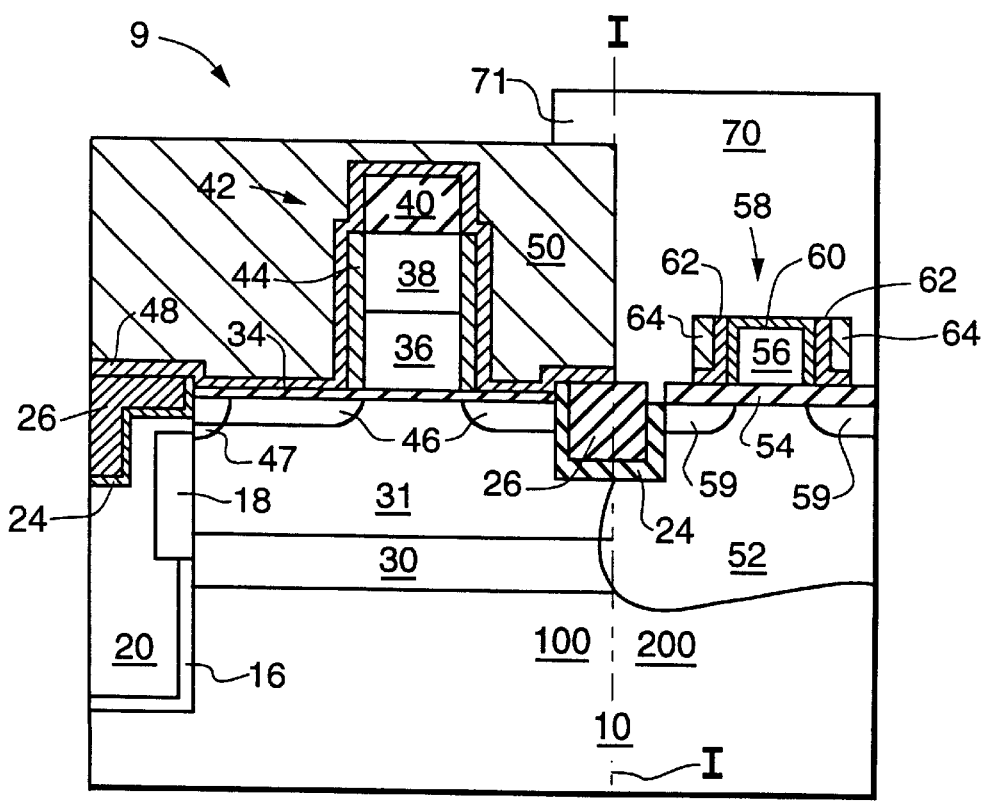
FIG. 8 is a cross sectional view of the silicon chip of FIG. 7, illustrating a completed logic gate stack in the logic region and a photoresist layer over the logic region.

Referring now to FIG. 8, logic sacrificial oxide 51 (shown in FIG. 7) is removed and a gate oxide 54 is grown in logic region 200. A polysilicon layer 56 is deposited, patterned, and etched, leaving a base for the logic gate stack 58. A sidewall oxidation step is performed, creating a sidewall oxide 60, nominally about 5 nm, on the sidewalls and top of polysilicon layer 56 of logic gate stack 58.

Logic extension implants 59 are then created in logic region 200. A nitride logic spacer 62 and a logic spacer oxide 64 are deposited over logic region 200. The logic spacer oxide 64 is etched, leaving only the oxide regions on the sidewalls of logic gate stack 58. The nitride logic spacer 62 is then removed by RIE except where covered by logic spacer oxide 64, leaving the intermediate structure of logic gate stack 58 as shown in FIG. 8. A photoresist 70 is then applied, pattern exposed, and developed as is known in the art, to remain only over logic region 200 and over STI trench 22b.

Figure 9:
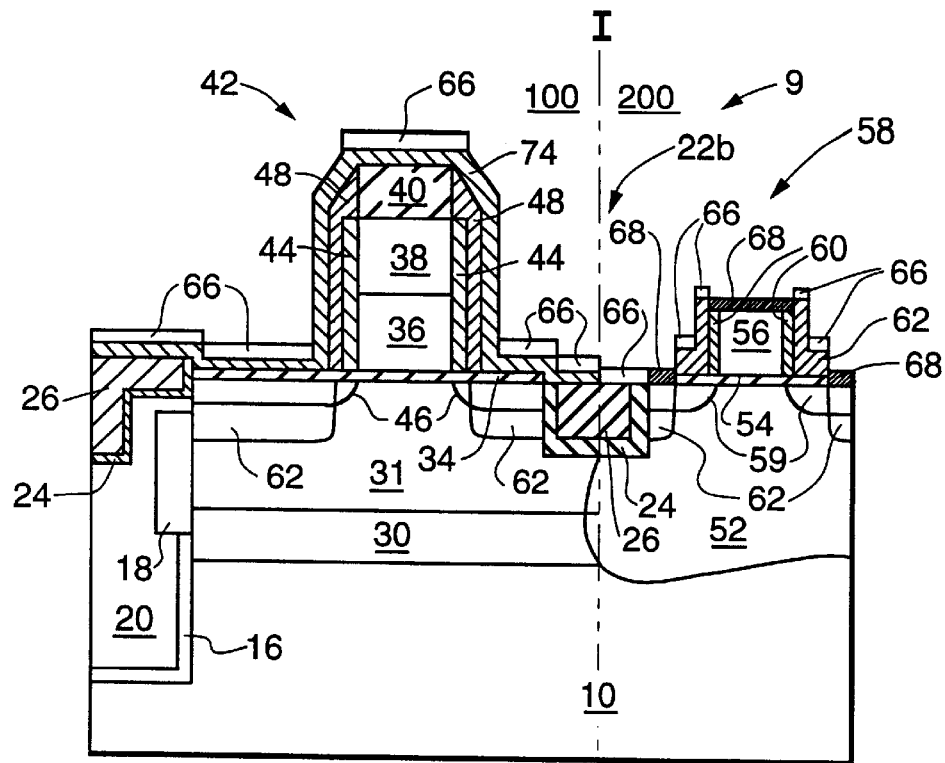
FIG. 9 is a cross sectional view of the silicon chip of FIG. 8, illustrating the memory and logic regions after cobalt or titanium salicide formation.

Referring now to FIG. 9, oxide protective layer 50 (shown in FIG. 8 over memory region 100) is optionally removed by an HF dip. The overhanging portion 71 of photoresist 70 that extends over STI trench 22b during this etching step, along with protective nitride layer 48, prevents oxide 26 from etching away during the etching step. Overetching of oxide protective layer 50 undercuts photoresist 70 and removes the oxide under overhanging portion 71 (shown in FIG. 8). Nitride layer 48 (also shown in FIG. 8) is then optionally etched by RIE to leave only a spacer on memory gate stack 42. Photoresist 70 over logic region 200 (shown in FIG. 8) is then removed.

This process may be made more robust by depositing a thin nitride (not shown) of about 50 Angstroms before the application of photoresist 70. Such a thin nitride is then etched with a RIE process after the resist is developed, after which the oxide is etched, such as with HF, and the nitride is etched with an isotropic chemical downstream etch (CDE) before photoresist 70 is stripped. The CDE step may be used to remove any stringers between memory region 100 and logic region 200.

As shown in FIG. 9, silicon nitride (SiN) layer 74, approximately 200 Angstroms thick, is deposited by low pressure chemical vapor deposition (LPCVD), rapid thermal chemical vapor deposition (RTCVD), or plasma enhanced chemical vapor deposition (PECVD) over both memory region 100 and logic region 200. SiN layer 74 is masked in memory region 100 and a RIE etch step is performed to remove the SiN layer 74 over logic region 200. An HF dip is performed to remove any residual, exposed portions of gate oxide 54 and sidewall oxide 60 (removed portions shown in FIG. 8).

Optionally, if conductive stringers (not shown) are present between memory region 100 and logic region 200, an isotropic etching step may be used to remove the stringers, using a block mask as is known in the art to block all but the border region between the memory and logic regions. Cobalt or titanium 66 is then sputtered over all horizontal surfaces. Where cobalt or titanium 66 lies directly over silicon or polysilicon regions, such as over gate polysilicon layer 56 in logic region 200, cobalt or titanium salicide (self aligned metal silicide) 68 is formed, shown by X-cross-hatched regions in FIG. 9.

Figure 13:
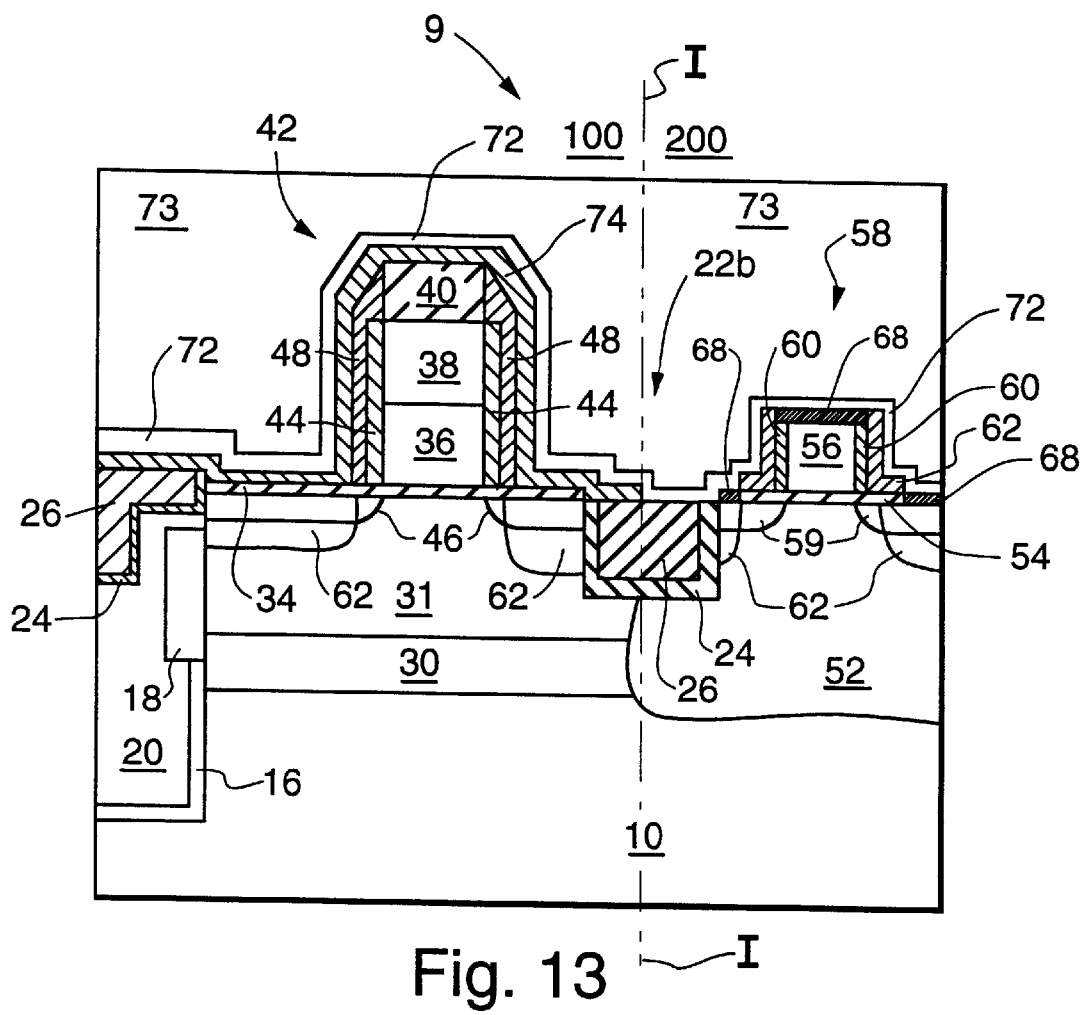
FIG. 13 is a cross sectional view of the silicon chip of FIG. 9 after formation of the uppermost nitride dielectric layers.

Referring now to FIG. 13, unreacted cobalt or titanium 66 (shown in FIG. 9) covering the horizontal surfaces of the nitride logic spacer 62 is removed by a wet etching process, such as a combination of peroxide and one or more acids such as nitric or sulfuric acid, as is known in the art. Then a barrier nitride layer 72 is deposited over the entire surface of chip 9, followed by a dielectric 73 such as a layer of flowable doped glass, for example Boro-Phospho Silicate Glass (BPSG) or fluorinated BPSG (F-BPSG), which is then densified. Dielectric 73 may be polished level with memory gate stack 42, or may extend above the stack 42 by several thousand Angstroms, as shown in FIG. 13. The remaining chip processing is standard as is known in the art.

In an alternative process, referring back to FIG. 8, oxide protective layer 50 may be left in place over memory region 100 during salicidation of the junctions (and gate), removal of the unreacted cobalt or titanium 66, and deposition of uppermost barrier nitride layer 72 over the both memory region 100 and logic region 200. Then, the doped glass, such as BPSG or F-BPSG, is deposited, and planarized to the level of barrier nitride layer 72 or oxide protective layer 50 over memory region 100. The rest of the processing is then standard as is known in the art.

Thus, as shown in FIG. 13, an exemplary semiconductor chip 9 of the present invention comprises at least one embedded memory device comprising memory gate stack 42 having an n-type polysilicon layer 36, a tungsten-containing (WSi$_x$ or W/WN) layer 38 on top of the polysilicon layer 36, and a silicon nitride cap layer 40 on top of the tungsten-containing layer 38. Exemplary chip 9 further comprises at least one high performance logic device comprising a logic gate stack 58 having a polysilicon layer 56 and a cobalt or titanium salicide layer 68 on top of the polysilicon layer 56.

As shown in FIG. 13, memory gate stack 42 further comprises a sidewall oxide 44 tuned for memory retention characteristics over the sidewalls of n-type polysilicon layer 36 and, optionally, over tungsten-containing layer 38 (if WSi$_x$), and a sidewall spacer nitride layer 48 over the oxide spacer and over the silicon nitride cap layer 40. Logic gate stack 58 consists essentially of polysilicon layer 56, sidewall oxide 60, and nitride logic spacer 62 over the sidewall oxide 60 and over a portion of substrate 10 immediately adjacent the sidewall oxide 60. Cobalt or titanium salicide 68 covers the polysilicon layer 56 and the horizontal surface of the exposed sidewall oxide 60.

Memory region 100 of semiconductor chip 9 further comprises silicon nitride layer 74. Logic region 200 further comprises cobalt or titanium salicide 68 over the top surface of substrate 10, such as over nitride logic spacer 62 which forms source and drain regions. Uppermost barrier nitride layer 72 covers both memory region 100 and logic region 200, and dielectric 73 (such as BPSG or F-BPSG) covers the uppermost barrier nitride layer 72.

Figure 10:
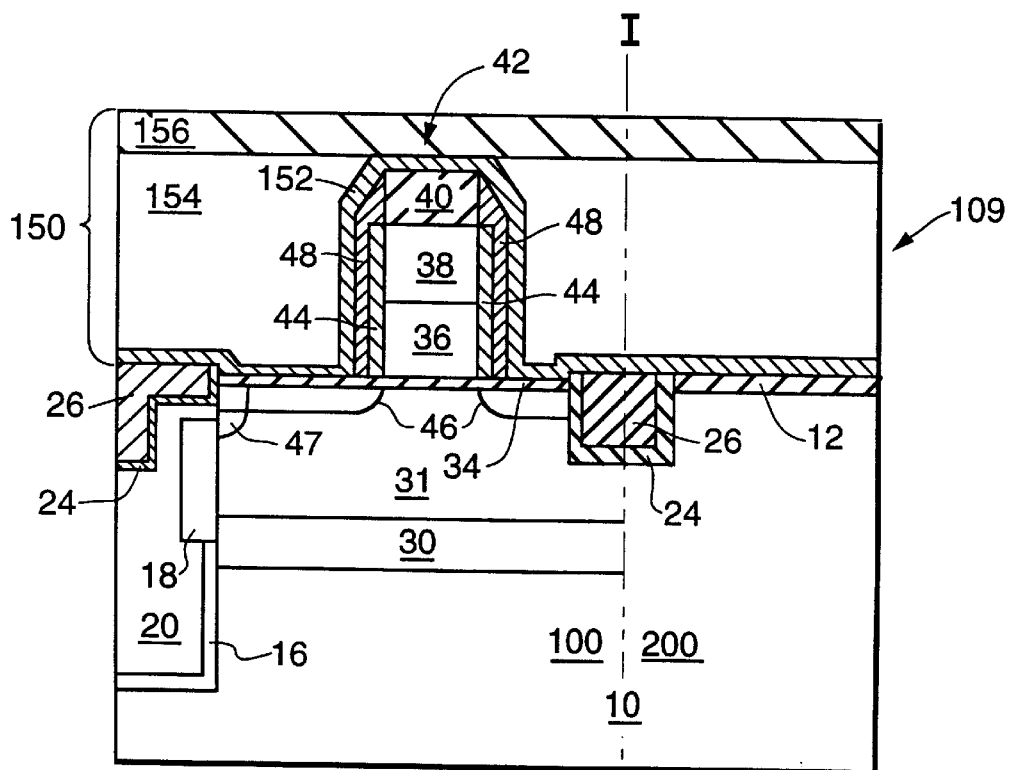
FIG. 10 is a cross sectional view of the silicon chip of FIG. 5, illustrating an alternate embodiment having a nitride-BPSG-TEOS protective layer.

In another embodiment of the present invention, the steps as recited above, up to and including those shown completed in FIG. 5, are the same. As shown in FIG. 10, however, when spacer nitride layer 48, typically about 10 to 40 nm, is deposited on the chip 109, it is immediately etched to form a spacer on memory gate stack 42. Next, protective layer 150 is formed. Protective layer 150 comprises a barrier SiN layer 152, deposited by PECVD, RTCVD, or LPCVD; followed by a BPSG layer 154, which is deposited, reflowed (densified), and polished level with memory gate stack 42; and finally TEOS layer 156, having a thickness of 200 to 5,000 Angstroms, on top of BPSG layer 154.

Figure 11:
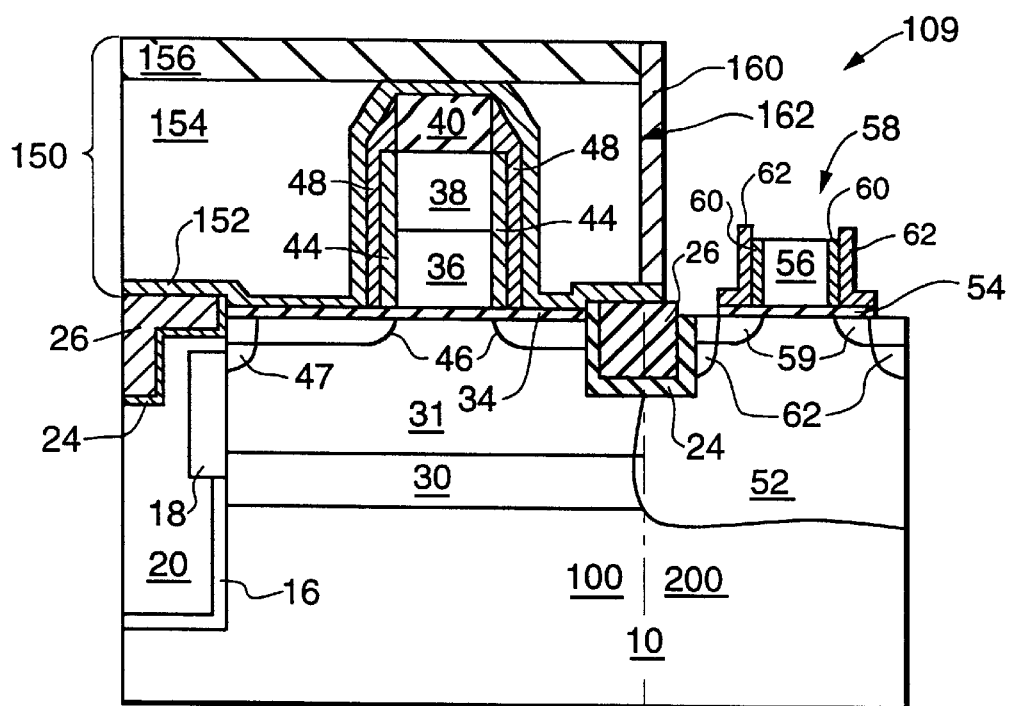
FIG. 11 is a cross sectional view of the silicon chip of FIG. 10 after formation of the logic transistor.

Referring now to FIG. 11, photoresist, not shown, is exposed over logic region 200 so that protective layer 150 is etched away over logic region 200, such as by an HF etch. The photoresist is then removed. Another layer of TEOS is then deposited and etched to remain only as a TEOS spacer 160 on the sidewall 162 of protective layer 150 over memory region 100. Barrier SiN layer 152 and pad nitride layer 12 (shown in FIG. 10) in logic region 200 are then removed by RIE or by hot phosphoric acid. Logic sacrificial oxide 51 is grown (and later removed), and logic well implant 52 and logic gate stack 58 are created as previously described, including an HF dip to remove residual, exposed oxide in logic region 200.

Figure 12:
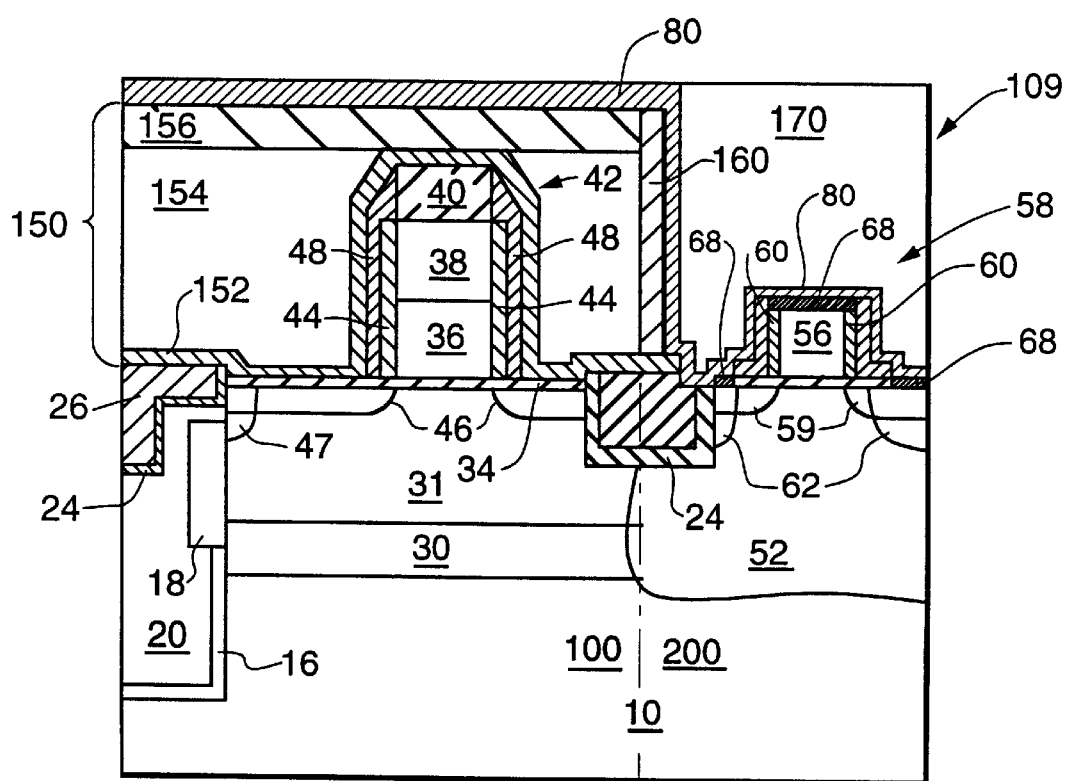
FIG. 12 is a cross sectional view of the silicon chip of FIG. 11 after formation of the uppermost nitride dielectric layers.

Referring now to FIG. 12, the cobalt or titanium sputtering step as previously described is then completed, along with an annealing step, forming regions of unreacted cobalt or titanium 66 and cobalt or titanium salicide 68 where indicated. The unreacted cobalt or titanium 66 is removed by wet etching. Next, a SiN layer 80 is deposited everywhere, such as by PECVD and RTCVD. A BPSG filler 170 is then deposited on logic region 200 and polished level with SiN layer 80 on top of memory region 100.

The resulting semiconductor chip 109 as shown in FIG. 12 thus has a memory gate stack 42 and a logic gate stack 58 similar to that shown in FIG. 9 and described above. Memory region 100, however, further comprises barrier silicon nitride layer 152, BPSG layer 154 which surrounds the memory gate stack level with the barrier silicon nitride layer 152, and TEOS layer 156 over the BPSG layer 154 and over the barrier silicon nitride layer 152 over memory gate stack 42. TEOS spacer 160 separates memory region 100 from logic region 200. Uppermost silicon nitride layer 80 extends over TEOS layer 156, over TEOS spacer 160, over logic gate stack 58, and over cobalt or titanium salicide 68 layers in logic region 200. Logic region 200 further has a BPSG filler 170 that is level with the top surface of silicon nitride layer 80 over memory region 100.

An advantage of the various embodiments of the above process is that the process is compatible both with an advanced DRAM process that creates memory cells with nitride films on top, allowing a borderless contact between the gate and memory cell, and with a high performance logic process that creates a logic device without such a nitride film on top.

Another important advantage of the process according to the present invention is that the formation of memory sidewall oxide 44 is completely decoupled from the formation of the logic sidewall oxide 60. Thus, memory sidewall oxide 44 may be tailored for improved memory retention characteristics whereas logic sidewall oxide 60 may be tailored for improved logic device performance. Also, because the entire set of memory processing steps is completed before the logic well implants 52 are created, the logic device suffers absolutely no degradation due to exposure to high temperature memory processing steps. Finally, in the embodiment disclosed and shown in FIGS. 10 through 12, in which the BPSG layer 154 is deposited before logic gate formation, the BPSG layer 154 can be densified at high temperature (thus allowing a tight-pitch memory array) without adversely affecting the logic devices.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for fabricating a semiconductor chip with a memory device in a memory region and a logic device in a logic region on a single chip, the process comprising the following steps in the given order;

(a) first, completely forming the memory device in the memory region;

(b) then, protecting the completed memory device, and completely forming the logic device in the logic region; and (c) finally, depositing an uppermost nitride layer over both the logic region and the memory region and depositing a dielectric layer over the nitride layer.

2. The process of claim 1 wherein step (b) comprises protecting the completed memory device with a layer of one of TEOS, HDP oxide, or a combination of a barrier nitride layer, a BPSG layer, and a TEOS layer.

3. The process of claim 2 wherein step (b) comprises initially protecting the completed memory device with the layer of TEOS or HDP oxide, removing the TEOS or HDP oxide after formation of a logic gate stack and one or more logic well implants, and depositing a protective nitride layer over the memory region before creating a metal salicide over selected portions of the logic device.

4. The process of claim 2 wherein step (b) comprises protecting the completed memory device with the layer of TEOS or HDP oxide during creation of a metal salicide over selected portions of the logic device.

5. The process of claim 2 wherein step (b) comprises protecting the completed memory device with the combination of a barrier nitride layer, a BPSG layer, and a TEOS layer, and further comprises densifying the BPSG layer at high temperature before forming the logic device.

6. The process of claim 1 wherein step (a) comprises forming a sidewall oxide on the memory device tailored to memory retention characteristics and step (b) comprises forming a sidewall oxide on the logic device tailored to optimal logic device performance.

7. The process of claim 6 comprising forming a memory device sidewall oxide having a lesser thickness than the logic device sidewall oxide.

8. A process for fabricating a semiconductor chip having a memory device and a logic device on the same chip, the process comprising the following steps in the given order:

(a) providing a substrate having a top surface, a memory region, a logic region, a pad nitride layer overlying the substrate top surface in the memory region, and a plurality of shallow trench isolation trenches;

(b) forming the memory device in the memory region;

(c) applying first a spacer nitride layer and second a protective layer over both the memory region and the logic region and then removing the protective layer over the logic region to expose the substrate;

(d) forming the logic device in the logic region, including applying a metal, selected from the group consisting of cobalt and titanium, over all horizontal surfaces in the logic region, conducting an annealing step sufficient for the metal to form a metal salicide where the metal rests over silicon regions and where the metal rests over polysilicon regions, and removing unreacted metal over non-silicon and non-polysilicon regions;

(e) depositing an uppermost nitride layer over both the logic region and the memory region; and (f) depositing a dielectric over the nitride layer.

9. The process of claim 8 wherein step (b) comprises forming the memory device by forming memory well implants, a memory gate oxide layer, a memory gate stack having sidewalls, a gate sidewall oxide, and memory array extension implants; and step (d) comprises forming the logic device by forming logic well implants, a logic gate oxide layer, a logic gate stack having sidewalls and a top, an oxide over the gate top and sidewalls, and logic extension implants before applying the metal.

10. The process of claim 9 wherein step (a) includes providing a pad nitride layer overlying the substrate top surface and then removing the pad nitride to expose the substrate top surface in the memory region.

11. The process of claim 10 wherein step (b) includes the steps of:

i) growing a sacrificial oxide layer over the exposed substrate in the memory region;

ii) forming the memory well implants;

iii) removing the sacrificial oxide to expose the substrate;

iv) growing a gate oxide over the exposed substrate;

v) depositing first a layer of n-type polysilicon, second a tungsten-containing layer comprising one of tungsten silicide or a combination of tungsten and tungsten nitride, and third, a cap layer of silicon nitride;

vi) patterning and etching the layers deposited in step (iv) to form the memory gate stack;

vii) growing a gate sidewall oxide tuned for memory retention characteristics on the polysilicon sidewall and, optionally, on the tungsten-containing layer sidewall of the memory gate stack; and viii) creating the memory array extension implants.

12. The process of claim 10 wherein step (d) includes the steps of:

i) growing a sacrificial oxide layer over the exposed substrate in the logic region;

ii) forming the logic well implants;

iii) removing the sacrificial oxide to expose the substrate;

iv) growing a gate oxide over the exposed substrate;

v) depositing a polysilicon layer;

vi) patterning and etching the polysilicon layers to form a logic gate base having a top and a plurality of sidewalls;

vii) growing an oxide on the top and the sidewalls of the polysilicon logic gate base;

viii) depositing a nitride logic spacer and then a logic spacer oxide over the logic region, and etching the logic spacer oxide to leave oxide only on the logic gate base sidewalls;

ix) removing the nitride logic spacer by RIE, leaving the logic gate stack; and x) creating the logic extension implants.

13. The process of claim 8 wherein removing the protective layer over the logic region to expose the substrate in step (c) includes the steps of:

i) depositing a photoresist over the memory region and the logic region;

ii) pattern exposing and developing the photoresist to remove the photoresist over the logic region;

iii) removing the protective layer over the logic region, and any stringers, using an etching step; and iv) removing the photoresist over the memory region.

14. The process of claim 13 wherein the etching step in step (c)(iii) comprises a hydrofluoric acid etch.

15. The process of claim 13 wherein removing the spacer nitride layer in step (c)(iv) comprises one of a reactive ion etching step or a hot phosphoric acid etching step.

16. The process of claim 13 wherein step (d) includes, before applying the metal, the steps of:

(d1) removing the protective layer over the memory region;

(d2) etching the spacer nitride layer in the memory region to leave only a spacer on the memory gate stack sidewalls;

(d3) forming a barrier nitride layer over both the memory region and the logic region; and (d4) removing the barrier nitride layer in the logic region.

17. The process of claim 16 wherein step (d1) comprises depositing photoresist over the logic region, dipping the chip in hydrofluoric acid to remove the protective layer over the memory region, and then removing the photoresist over the logic region after step (d2).

18. The process of claim 17 wherein step (d2) comprises etching the spacer nitride layer by reactive ion etching.

19. The process of claim 16 wherein forming the barrier nitride layer in step (d3) comprises depositing a layer of silicon nitride approximately 200 Angstroms thick by one of plasma enhanced chemical vapor deposition, low pressure enhanced chemical vapor deposition, or rapid thermal chemical vapor deposition.

20. The process of claim 16 wherein step (d4) comprises masking the barrier nitride layer over the memory region and removing the barrier nitride layer over the logic region by reactive ion etching.

21. The process of claim 16 wherein step (d4) further comprises after the reactive ion etching step, dipping the chip in hydrofluoric acid to remove any residual oxide and sidewall oxide.

22. The process of claim 13 wherein applying the protective layer in step (c) comprises depositing a protective layer consisting of one of TEOS or HDP oxide.

23. The process of claim 22 wherein the process further comprises leaving the protective layer over the memory region during steps (d), (e), and (f), and planarizing the dielectric to be level with one of the uppermost nitride layer or the protective layer over the memory region.

24. The process of claim 22 further comprising between steps (c)(iii) and (c)(iv), removing the spacer nitride layer over the logic region to expose the substrate in the logic region.

25. The process of claim 22 wherein after applying the spacer nitride layer in step (c), the process further comprises etching the spacer nitride layer to leave only a spacer on the memory gate stack sidewalls.

26. The process of claim 25 wherein applying the protective layer in step (c) comprises depositing a barrier nitride layer, a BPSG layer on top of the barrier nitride layer, and a TEOS layer on top of the BPSG layer.

27. The process of claim 26 wherein after depositing the BPSG layer in step (c), the process first comprises reflowing the BPSG and polishing the BPSG down to the memory gate stack, before depositing the TEOS layer.

28. The process of claim 26 wherein step (d) includes, before applying the metal, forming a TEOS spacer between the logic region and the memory region.

29. The process of claim 28 further comprising, after forming the TEOS spacer, removing the barrier nitride layer over the logic area.

30. The process of claim 29 further comprising removing the barrier nitride layer over the logic area by one of reactive ion etching or etching with hot phosphoric acid.

31. The process of claim 30 wherein step (d) includes, before applying the metal, removing residual oxide from the logic region by dipping the chip in hydrofluoric acid.

32. The process of claim 30 wherein step (d) further comprises removing the unreacted metal using a wet etch step, and step (f) comprises disposing the dielectric over the uppermost nitride layer in the logic region by depositing a BPSG layer over both the memory region and the logic region, and then polishing the BPSG to be level with the uppermost nitride layer over the TEOS layer in the memory region.

33. The process of claim 8 wherein step (d) further comprises removing the unreacted metal with a wet etch step.

34. The process of claim 8 wherein step (d) includes, before applying the metal, using a block mask to mask the chip except in a border region between the memory region and the logic region, and isotropically etching the border region to remove any conductive stringers.

* * * * *